US012324223B2

(12) United States Patent
Tsai (10) Patent No.: US 12,324,223 B2
(45) Date of Patent: Jun. 3, 2025

(54) MANUFACTURING METHOD OF INTEGRATED STRUCTURE OF SEMICONDUCTOR DEVICES HAVING SPLIT GATE

(71) Applicant: Richtek Technology Corporation, Zhubei (TW)

(72) Inventor: Chin-Chin Tsai, Tainan (TW)

(73) Assignee: RICHTEK TECHNOLOGY CORPORATION, Zhubei (TW)

( * ) Notice: Subject to any disclaimer, the term of this patent is extended or adjusted under 35 U.S.C. 154(b) by 518 days.

(21) Appl. No.: 17/899,609

(22) Filed: Aug. 30, 2022

(65) Prior Publication Data
US 2023/0402327 A1 Dec. 14, 2023

(30) Foreign Application Priority Data
Jun. 10, 2022 (TW) .................................. 111121628

(51) Int. Cl.
*H10D 84/01* (2025.01)
*H10D 84/03* (2025.01)
*H10D 84/80* (2025.01)

(52) U.S. Cl.
CPC ....... *H10D 84/038* (2025.01); *H10D 84/0142* (2025.01); *H10D 84/0149* (2025.01); *H10D 84/811* (2025.01)

(58) Field of Classification Search
CPC . H10D 30/6892; H10D 30/696; H10D 84/813
See application file for complete search history.

(56) References Cited

U.S. PATENT DOCUMENTS

| | | | |
|---|---|---|---|
| 6,522,587 B1 * | 2/2003 | Furuhata ................ | H10B 41/40 |
| | | | 257/389 |
| 9,330,923 B1 * | 5/2016 | Shih ....................... | H10B 41/30 |
| 10,269,909 B1 * | 4/2019 | Yang ...................... | H01L 21/324 |
| 2018/0166451 A1 * | 6/2018 | Yang .................... | H10D 30/696 |

* cited by examiner

*Primary Examiner* — Benjamin P Sandvik
*Assistant Examiner* — Dmitri Mihaliov
(74) *Attorney, Agent, or Firm* — Tung & Associates (57) ABSTRACT

A manufacturing method of an integrated structure of semiconductor devices having split gates includes: forming a first silicon nitride layer covering a low voltage device and a high voltage device; etching back the first silicon nitride layer by an etching process step to form a residue silicon nitride region between two adjacent low voltage gates; forming a silicon oxide layer, a second silicon nitride layer, and a metal layer; forming two split gates by an etching process step; forming a contact etch stop layer (CESL); etching the CESL by an etching process step to form plural contacts in the CESL, wherein the contact between the two adjacent low voltage gates exposes at least part of a top surface of a common low voltage source on a substrate; and forming plural conductive plugs in the plural contacts respectively, wherein each of the conductive plug fills up the corresponding contact.

12 Claims, 13 Drawing Sheets

MANUFACTURING METHOD OF INTEGRATED STRUCTURE OF SEMICONDUCTOR DEVICES HAVING SPLIT GATE

CROSS REFERENCE

The present invention claims priority to TW 111121628 filed on Jun. 10, 2022.

BACKGROUND OF THE INVENTION

Field of Invention

The present invention relates to a manufacturing method of an integrated structure of semiconductor devices having split gates. Particularly, the present invention relates to such a manufacturing method which integrates a low voltage device, a high-voltage device and/or a metal-insulator-polysilicon (MIP) capacitor in one manufacturing process.

Description of Related Art

Figure 1A:
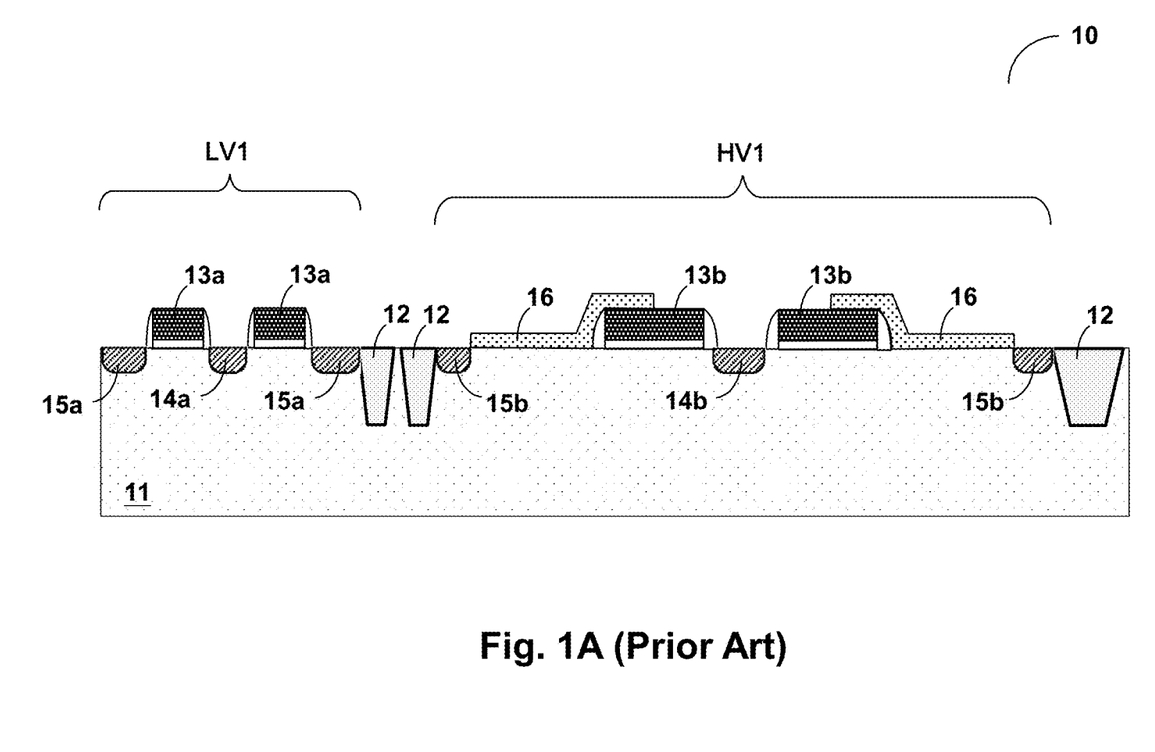
FIGS. 1A-1E are schematic cross-sectional views illustrating a manufacturing method of an integrated structure 10 of a semiconductor device having split gates according to a conventional art.

Please refer to FIGS. 1A-1E, which are cross-sectional schematic diagrams of a conventional manufacturing method of an integrated structure 10 of semiconductor devices having split gates. As shown in FIG. 1A, first, plural insulating regions 12 are formed to electrically isolate a low-voltage device LV1 and a high-voltage device HV1 on a substrate 11. Two low-voltage gates 13a of the low-voltage device LV1 are formed on the substrate 11, and a common low-voltage source 14a and two low-voltage drains 15a of the low-voltage device LV1 are formed in the substrate 11. On the other hand, two high-voltage gates 13b and two reduced surface field (RESURF) oxide regions 16 of the high-voltage device HV1 are formed on the substrate 11, and a common high-voltage source 14b and two high-voltage drains 15b of the high-voltage device HV1 are formed in the substrate 11.

Figure 1B:
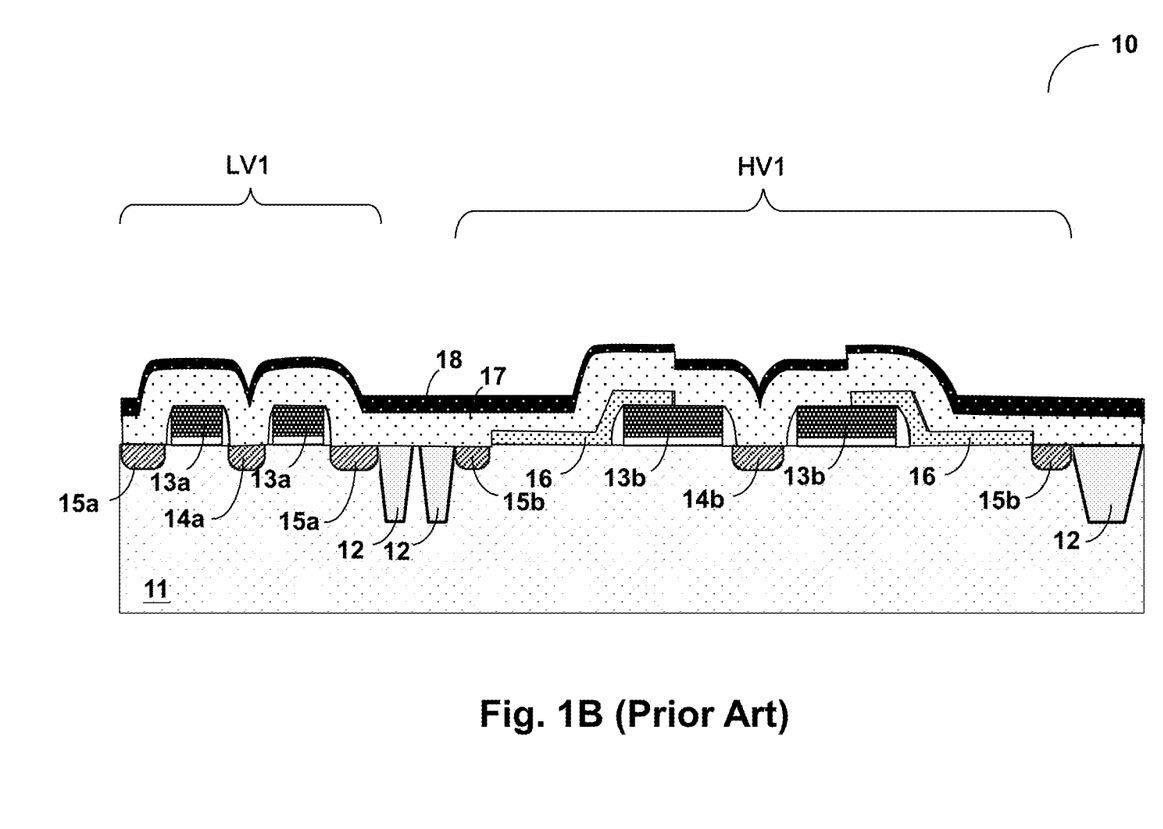

Next, referring to FIG. 1B, a silicon oxide layer 17 is formed on the substrate 11 to cover the low-voltage device LV1 and the high-voltage device HV1. And a metal layer 18 is formed to cover the silicon oxide layer 17.

Figure 1C:
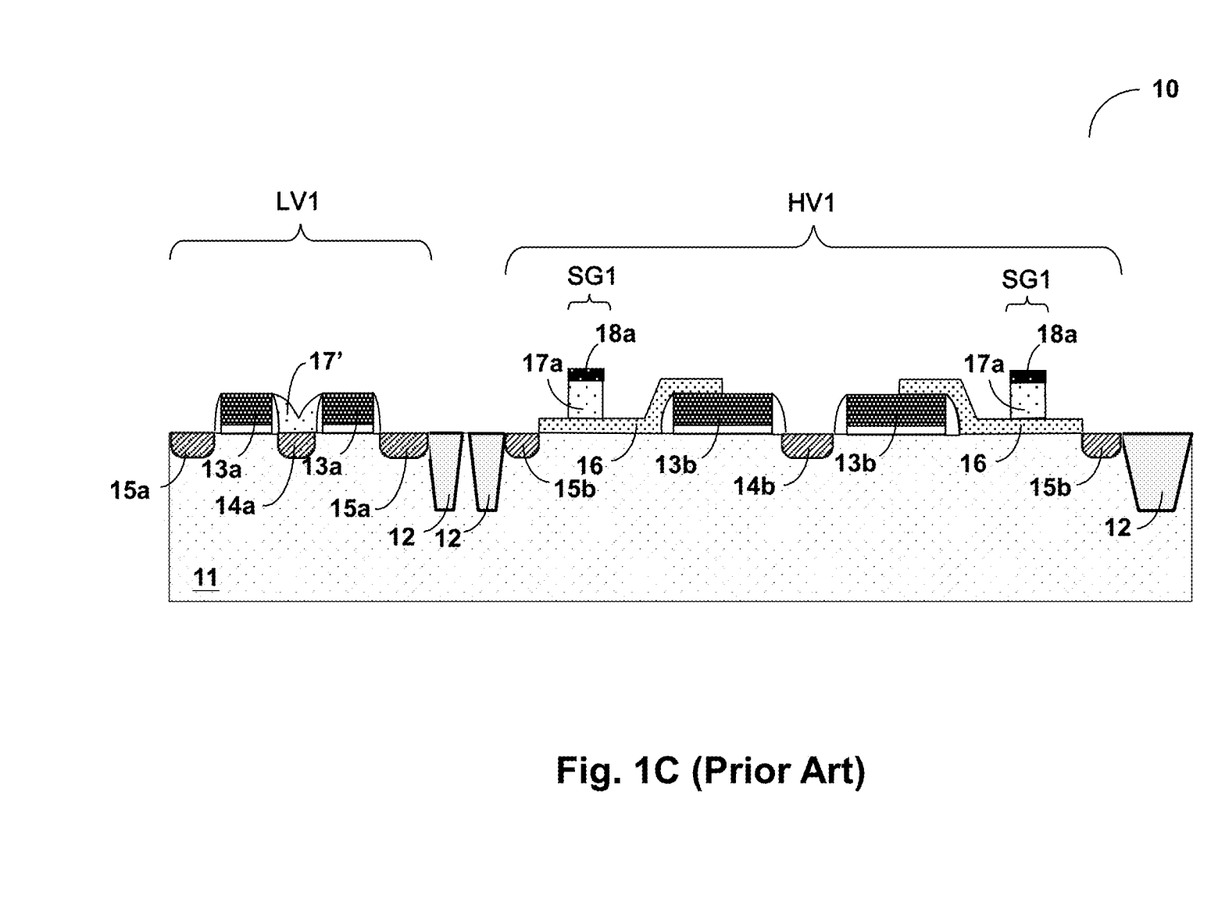

Next, referring to FIG. 1C, the silicon oxide layer 17 and the metal layer 18 are etched by an etching process to form two split gates SG1 respectively positioned on the two reduced surface field oxide regions 16. The split gate SG1 includes a silicon oxide region 17a and a top electrode 18a.

Please continue referring to FIG. 1C, the split gate SG1 serves for improving on-resistance and breakdown voltage characteristics of the high-voltage device HV1. In the conventional art, the thickness of the silicon oxide region 17a of the split gate SG1 generally needs to be at least 600 angstrom (Å). With such thickness, as shown in FIG. 1C, after the aforementioned etching process, in regions of the substrate 11 where the space between the structures is small, such as in the low-voltage device LV1 between the two low-voltage gates 13a, the silicon oxide layer 17 cannot be completely removed, so that a residual oxide region 17' will remain as shown in FIG. 1C.

Figure 1D:
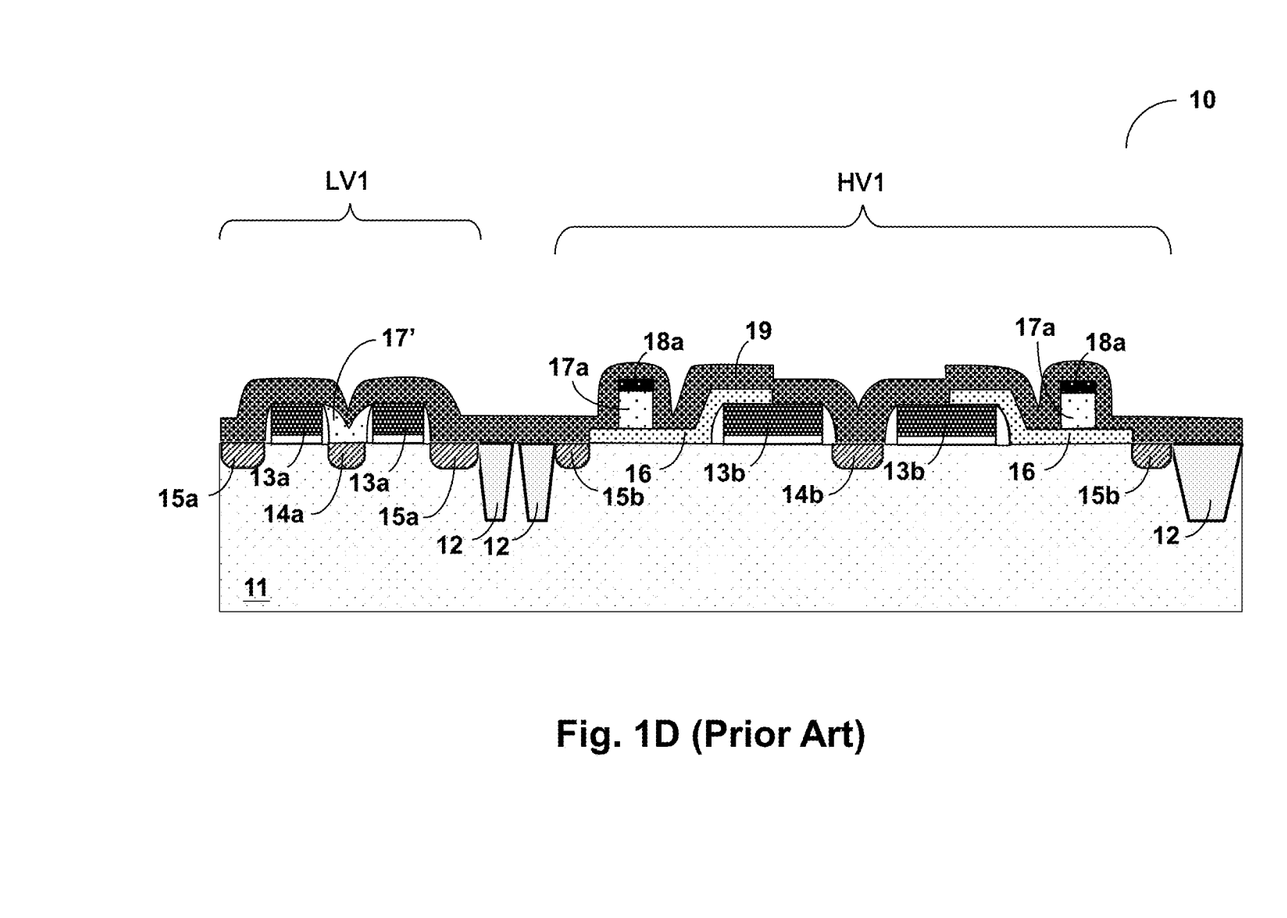

Next, referring to FIG. 1D, a contact etch stop layer (CESL) 19 is formed to cover the low-voltage device LV1 and the high-voltage device HV1.

Figure 1E:
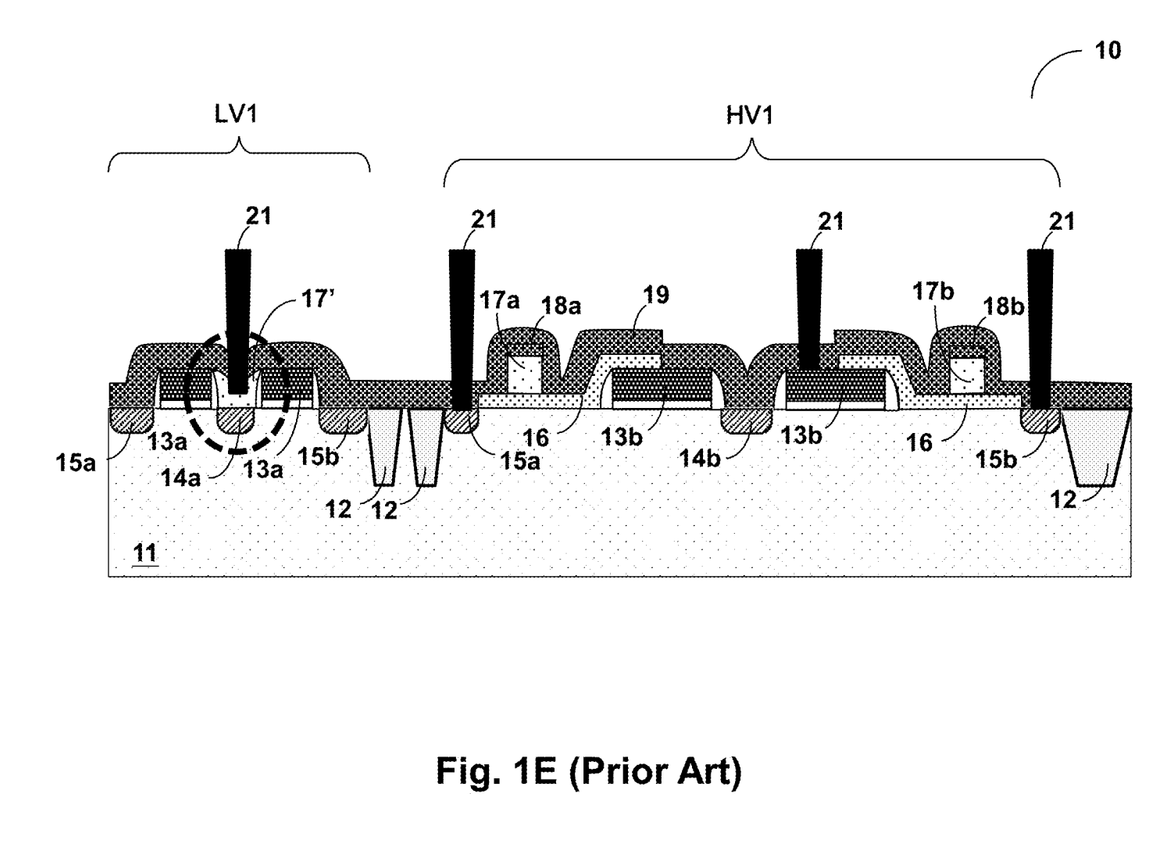

Next, referring to FIG. 1E, the contact etch stop layer 19 is etched back by an etching process to form plural contact holes, and then plural conductive plugs 21 are formed in the corresponding contact holes.

As indicated by a thick dashed circle in FIG. 1E, the aforementioned residual oxide region 17' blocks the conductive plug 21 from contacting the common low-voltage source 14a, so that the conductive plug 21 cannot be electrically connected to the low-voltage source 14a, causing the low-voltage device LV1 to operate abnormally.

In view of the above, the present invention proposes a manufacturing method of an integrated structure of a semiconductor device with split gates, which can avoid the formation of the residual oxide region 17' and solve the problem that the conductive plug 21 cannot be electrically connected to the low-voltage source 14a.

SUMMARY OF THE INVENTION

From one perspective, the present invention provides a manufacturing method of an integrated structure of a semiconductor device having split gates, comprising: forming two low-voltage gates of a low-voltage device on a substrate and forming a common low-voltage source and two low-voltage drains of the low-voltage device in the substrate; forming two high-voltage gates and two reduced surface field oxide regions of a high-voltage device on the substrate and forming a common high-voltage source and two high-voltage drains of the high-voltage device in the substrate; forming a first silicon nitride layer covering the low-voltage device and the high-voltage device; etching back the first silicon nitride layer by an etching process to form a residual silicon nitride layer on the substrate between the two adjacent low-voltage gates; forming a silicon oxide layer covering the low-voltage device and the high-voltage device; forming a second silicon nitride layer covering the silicon oxide layer; forming a metal layer covering the second silicon nitride layer; etching the metal layer, the second silicon nitride layer, and the silicon oxide layer by at least one etching process to form two split gates respectively on the two reduced surface field oxide regions, wherein each split gate comprises a split gate top electrode, a split gate silicon nitride region, and a split gate silicon oxide region; forming a contact etch stop layer covering the low-voltage device and the high-voltage device, wherein a material of the contact etch stop layer is silicon nitride; etching the contact etch stop layer by an etching process to form a plurality of contact holes in the contact etch stop layer, wherein the contact hole between the two low-voltage gates exposes at least part of a top surface of the common low-voltage source on the substrate; and forming a plurality of conductive plugs in the corresponding plurality of contact holes, wherein each of the conductive plugs fills in the corresponding contact holes from top to bottom.

In one embodiment, the manufacturing method further includes forming a metal-insulator-polysilicon (MIP) capacitor in the substrate, wherein the MIP capacitor includes: a MIP polysilicon region formed above the substrate; a MIP insulating region formed on and in contact with the MIP polysilicon region and the substrate; a MIP metal region formed on and in contact with the MIP insulating region; wherein the MIP metal region and the split gate top electrode are formed by one same process; wherein the MIP insulating region, the split gate silicon nitride region, and the split gate silicon oxide region are formed by one same process; and wherein the MIP polysilicon region and a high-voltage polysilicon region of the high-voltage gate are formed by one same process.

In one embodiment, a material of the split gate top electrode comprises polysilicon, titanium nitride, tantalum nitride, or tungsten.

In one embodiment, a material used for forming the split gate silicon oxide region comprises tetraethoxysilane (TEOS).

In one embodiment, the split gate silicon oxide region is formed by a high temperature oxidation (HTO) process or a high aspect ratio process (HARP).

In one embodiment, a thickness of the reduced surface field oxide region positioned directly under the split gate is 200 angstrom (Å).

In one embodiment, a thickness of the MIP insulating region ranges from 500 Å to 700 Å.

In one embodiment, a thickness of a low-voltage gate oxide layer of the low-voltage gate ranges from 80 Å to 130 Å.

In one embodiment, a gate driving voltage of the high-voltage gates ranges from 3.3V to 5V.

In one embodiment, a drain driving voltage of the high-voltage gates ranges from 6V to 30V.

In one embodiment, the split gate top electrode is electrically connected to the high-voltage gates or a ground potential.

In one embodiment, a minimum feature size of the integrated structure of the semiconductor device having split gates ranges from 0.05 micrometer (μm) to 0.3 μm.

The objectives, technical details, features, and effects of the present invention will be better understood with regard to the detailed description of the embodiments below, with reference to the attached drawings.

DESCRIPTION OF THE PREFERRED EMBODIMENTS

The drawings as referred to throughout the description of the present invention are for illustration only, to show the interrelations among the process steps and the layers, while the shapes, thicknesses, and widths are not drawn in actual scale.

Figure 2A:
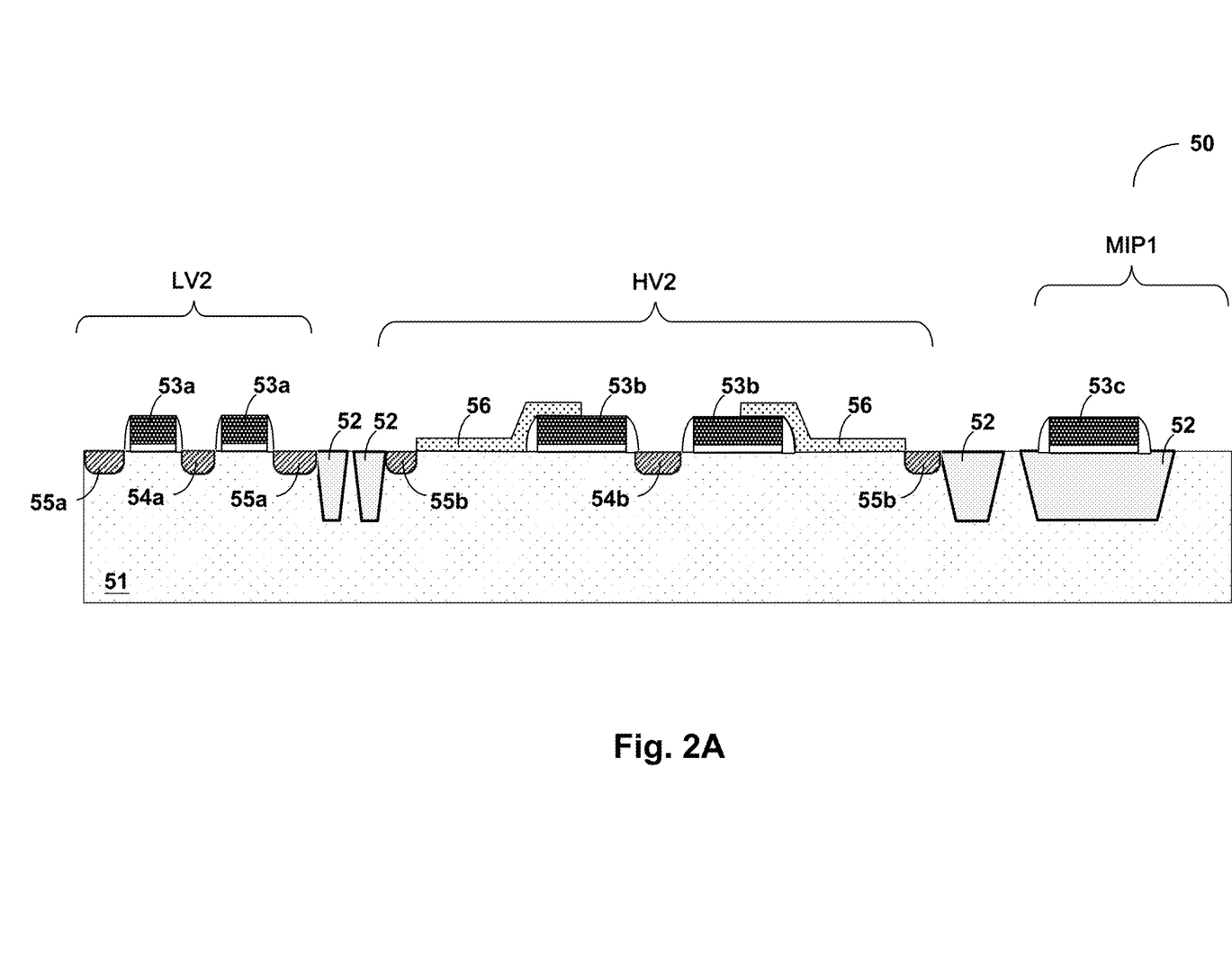
FIGS. 2A-2H are schematic cross-sectional views illustrating a manufacturing method of an integrated structure 50 of a semiconductor device having split gates according to an embodiment of the present invention.

Referring to FIGS. 2A-2H, which are schematic cross-sectional views illustrating a manufacturing method of an integrated structure 50 of a semiconductor device having split gates according to an embodiment of the present invention. As shown in FIG. 2A, a substrate 51 is first provided, and two low-voltage gates 53a of a low-voltage device LV2 are formed on the substrate 51, and a common low-voltage source 54a and two low-voltage drains of the low-voltage device LV2 are formed in the substrate 51. In addition, two high-voltage gates 53b and two reduced surface field oxide regions 56 of the high-voltage device HV2 are formed on the substrate 51, and a common high-voltage source 54b and two high-voltage drains 55b of the high-voltage device HV2 are formed in the substrate 51. Furthermore, in one embodiment, preferably, a polysilicon region 53c of a metal-insulator-polysilicon (MIP) capacitor MIP1 is formed on the substrate 51. In one embodiment, the MIP capacitor MIP1 is for example formed on an insulating region 52 as shown in FIG. 2A, to have better electrical properties.

The substrate 51 is, for example but not limited to, a P-type or N-type semiconductor substrate. Each of the low-voltage gates 53a and the high-voltage gates 53b includes a conductive layer, an spacer layer, and a dielectric layer. The dielectric layer is formed on and in contact with an upper surface of the substrate 51. The conductive layer includes an N-type polysilicon layer or a P-type polysilicon layer. The spacer layer covers outer sides of two sides of the conductive layer. The details of a transistor gate are well known to those skilled in the art, so such details are not redundantly explained here.

The common low-voltage source 54a, the two low-voltage drains 55a, the common high-voltage source 54b, and the two high-voltage drains 55b for example can be formed by implanting N-type or P-type impurities into their respective defined regions in the form of accelerated ions by an ion implantation process, which is well known to those skilled in the art, so the details are not redundantly explained here.

Figure 2B:
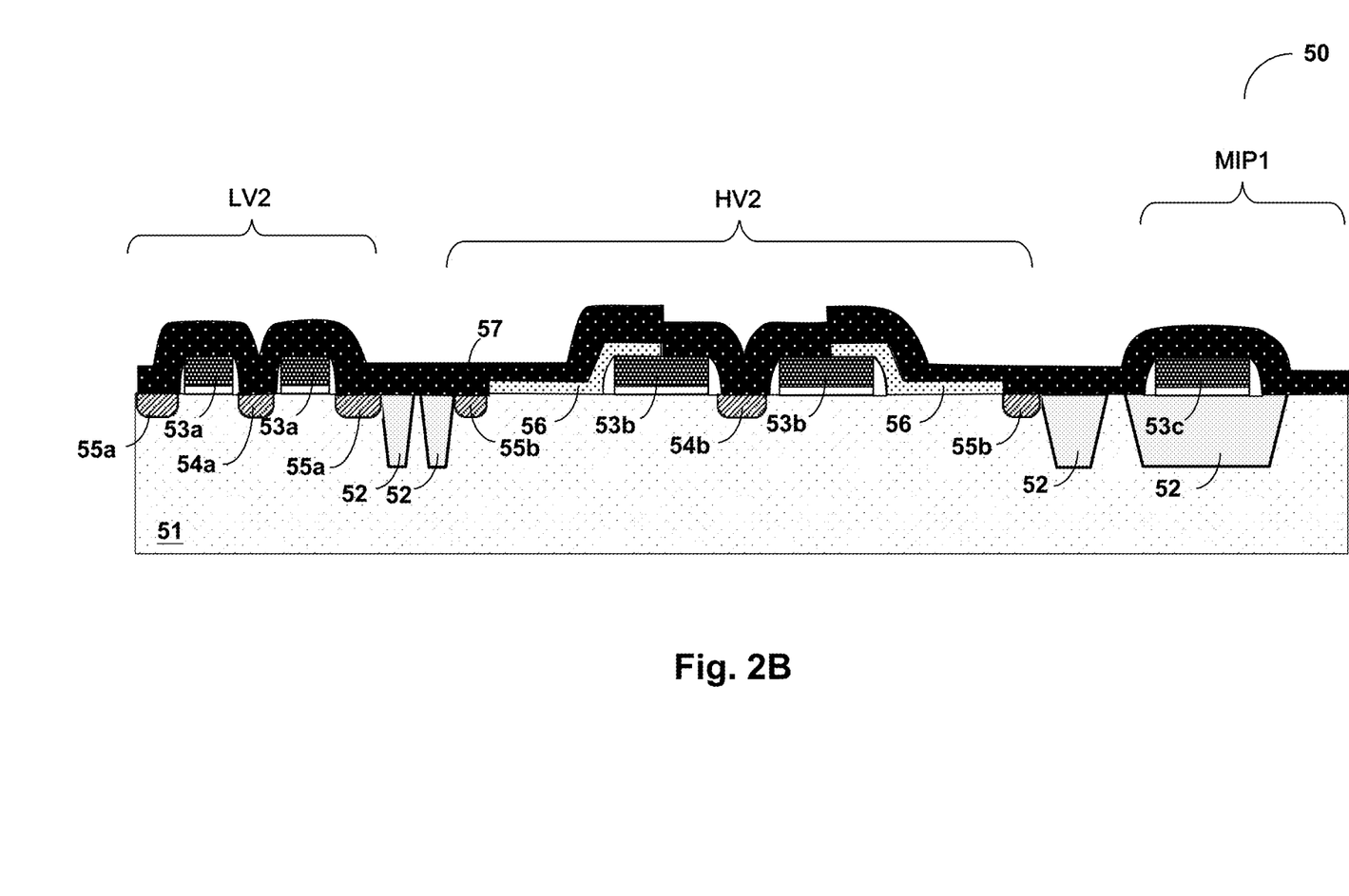

Next, referring to FIG. 2B, a first silicon nitride layer 57 is formed to cover the low-voltage device LV2, the high-voltage device HV2, and the MIP capacitor MIP1. The first silicon nitride layer 57 can be formed by, for example but not limited to, a deposition process, which is well known to those skilled in the art, so the details are not redundantly explained here.

Figure 2C:
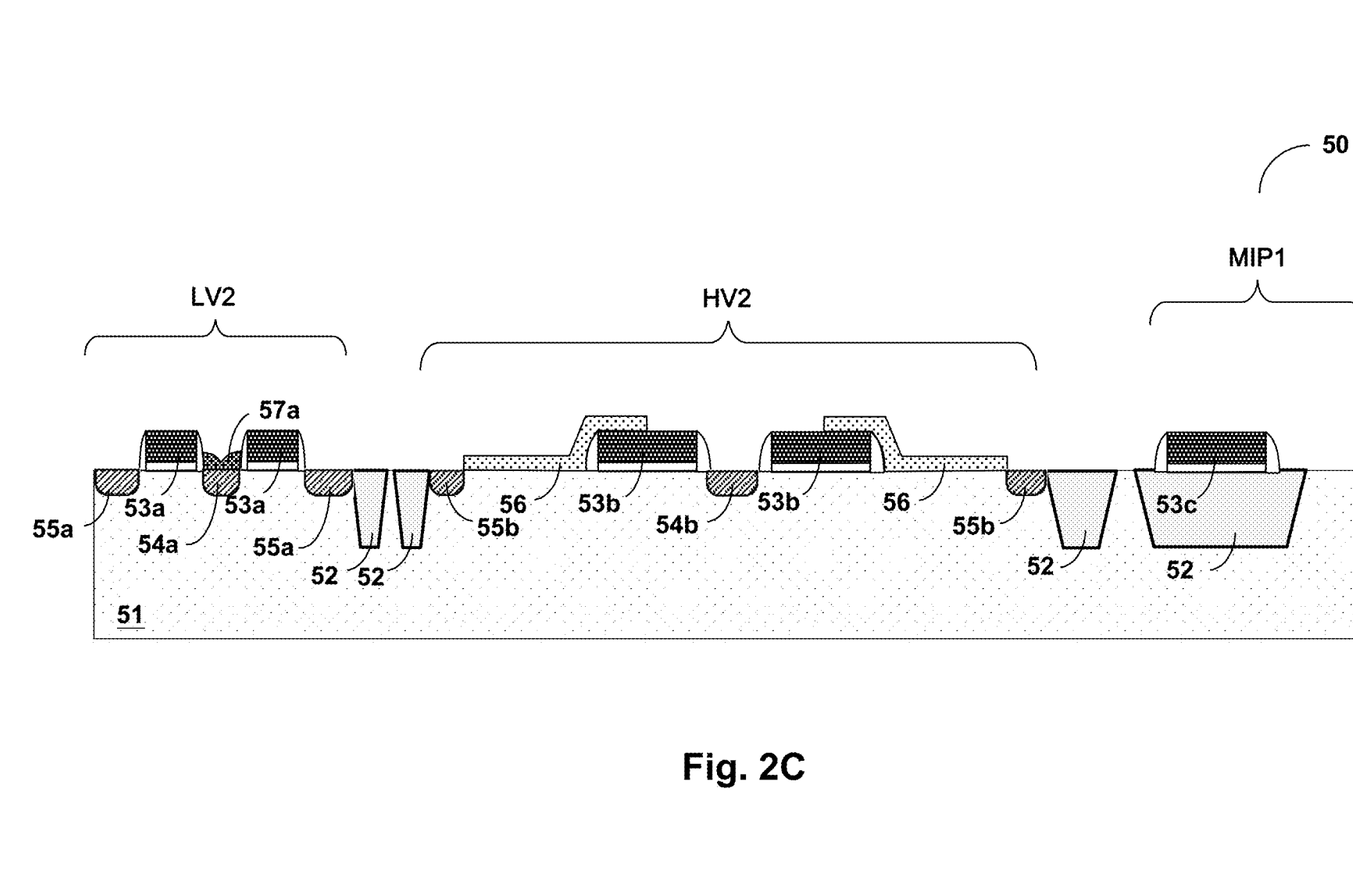

Next, referring to FIG. 2C, an etching process is performed to etch back the first silicon nitride layer 57, in a region with relatively small structural space, such as between the two low-voltage gates 53a shown in FIG. 2C, whereby a residual silicon nitride layer 57a is formed on the substrate 51 between the two adjacent low-voltage gates 53a.

Figure 2D:
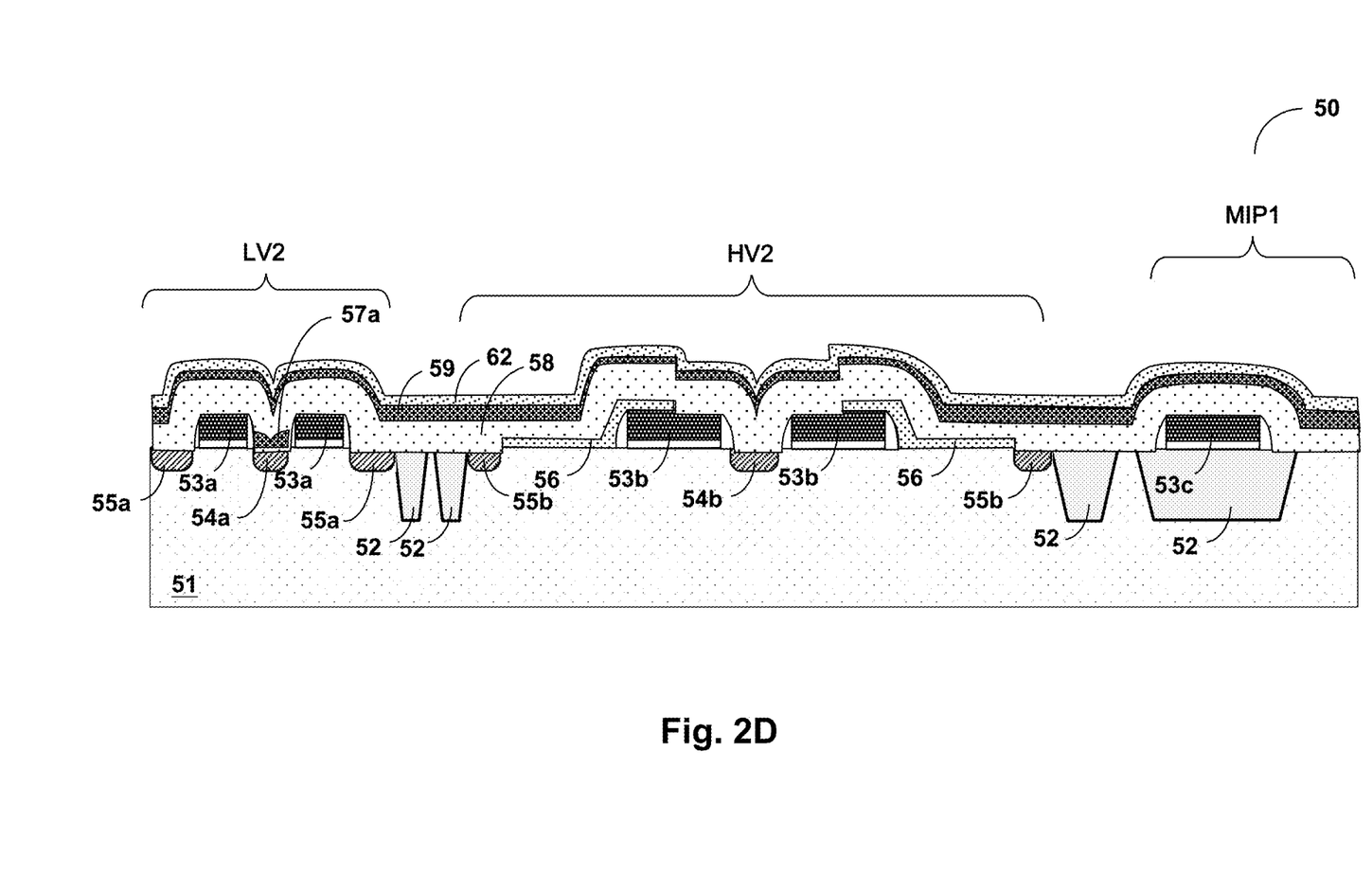

Next, referring to FIG. 2D, a silicon oxide layer 58 is formed to cover the low-voltage device LV2, the high-voltage device HV2, and the MIP capacitor MIP. A second silicon nitride layer 59 is formed to cover the silicon oxide layer 58, and a metal layer 62 is formed to cover the second silicon nitride layer 59. The silicon oxide layer 58, the second silicon nitride layer 59, and the metal layer 62 can be formed by, for example but not limited to, respective deposition processes, which is well known to those skilled in the art, so the details are not redundantly explained here.

Figure 2E:
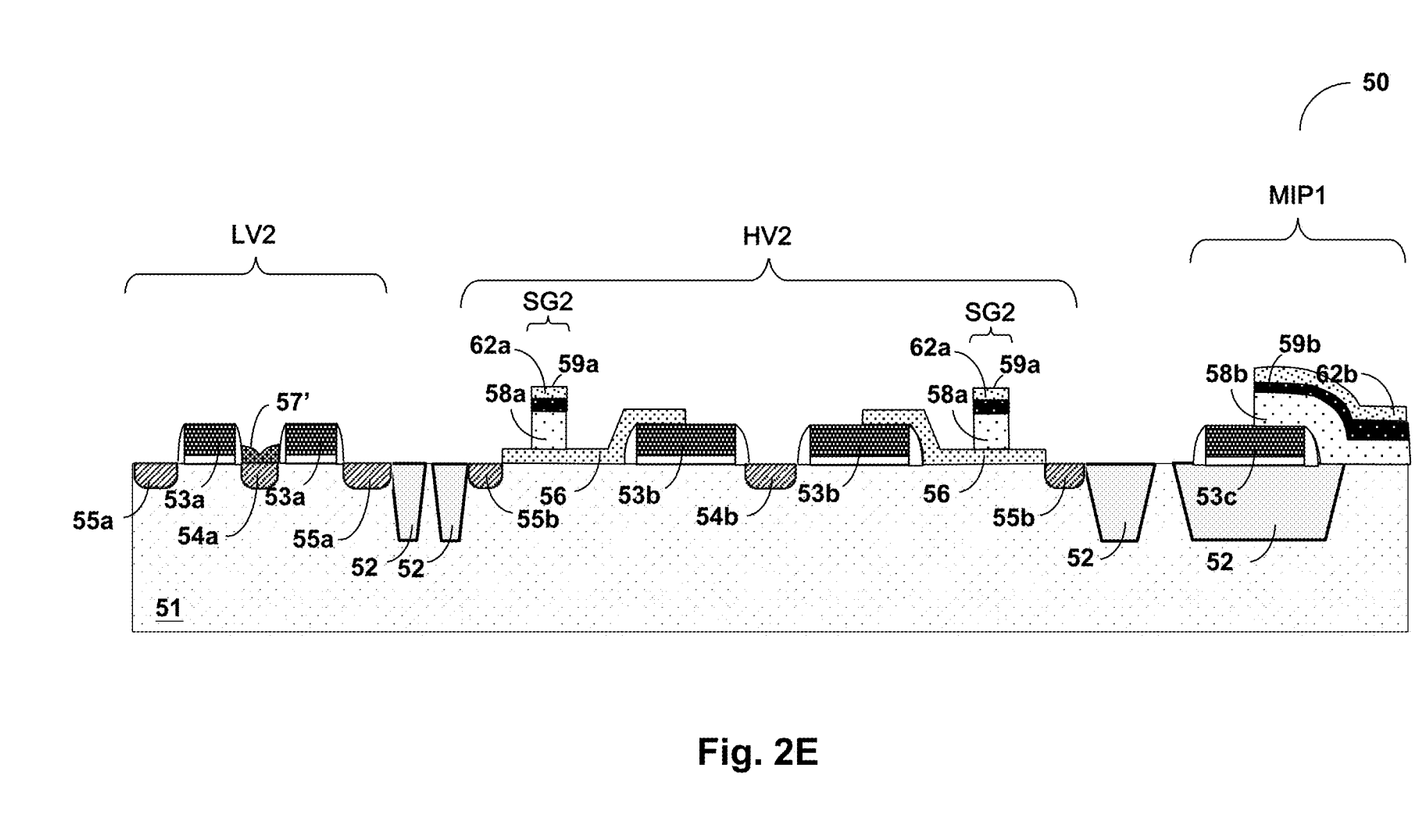

Next, referring to FIG. 2E, the metal layer 62, the second silicon nitride layer 59, and the silicon oxide layer 58 are etched by at least one etching process to form two split gates SG2 respectively on the two reduced surface field oxide regions 56, wherein the split gate SG2 includes split gate top electrode 62a, split gate silicon nitride region 59a, and split gate silicon oxide region 58a. In one embodiment, a MIP metal region 62b and a MIP insulating region of the MIP capacitor MIP1 are formed by at least one etching process that is the same as the etching process for etching the metal layer 62, the second silicon nitride layer 59, and the silicon oxide layer 58, wherein the MIP insulating region includes a MIP silicon nitride region 59b and a MIP silicon oxide region 58b.

That is, the MIP metal region 62b and the split gate top electrode 62a are formed by one same process. The MIP insulating region, the split gate silicon nitride region 59a, and the split gate silicon oxide region 59a are formed by one same process. The MIP polysilicon region 53c and the high-voltage polysilicon region of the high-voltage gate 53b are formed by one same process. The MIP polysilicon region 53c is formed above the substrate 51; the MIP insulating region is formed on and in contact with the MIP polysilicon region 53*c* and the substrate 51; and the MIP metal region 62*b* is formed on and in contact with the MIP insulating region, wherein a part of the MIP insulating region is formed on and in contact with the MIP polysilicon region 53*c*, and another part of the MIP insulating region is formed and in contact with the substrate 51.

Figure 2F:
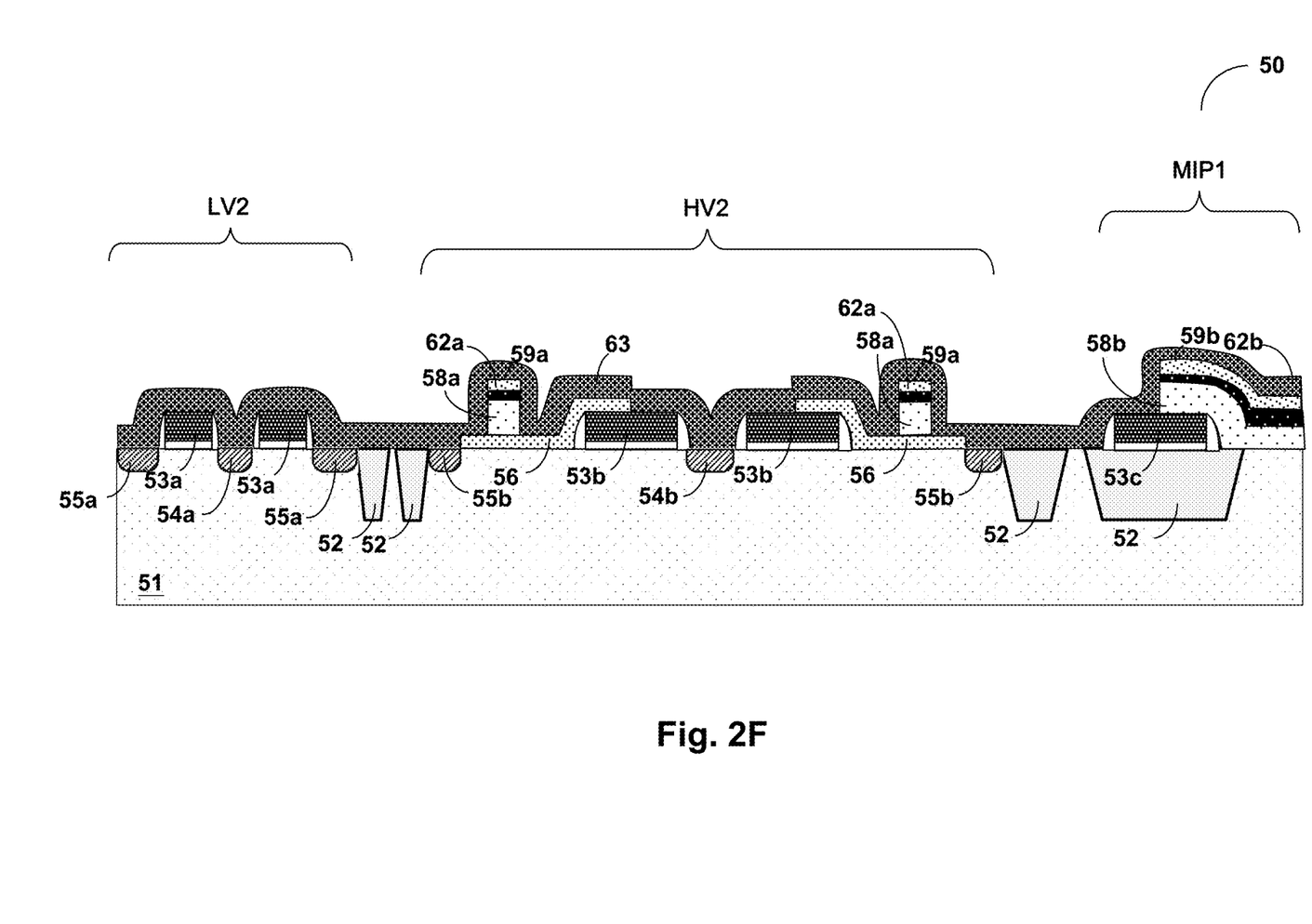

Next, referring to FIG. 2F, a contact etch stop layer 63 is formed to cover the low-voltage device LV2, the high-voltage device HV2, and the MIP capacitor MIP1, wherein the contact etch stop layer 63 is made of silicon nitride.

Figure 2G:
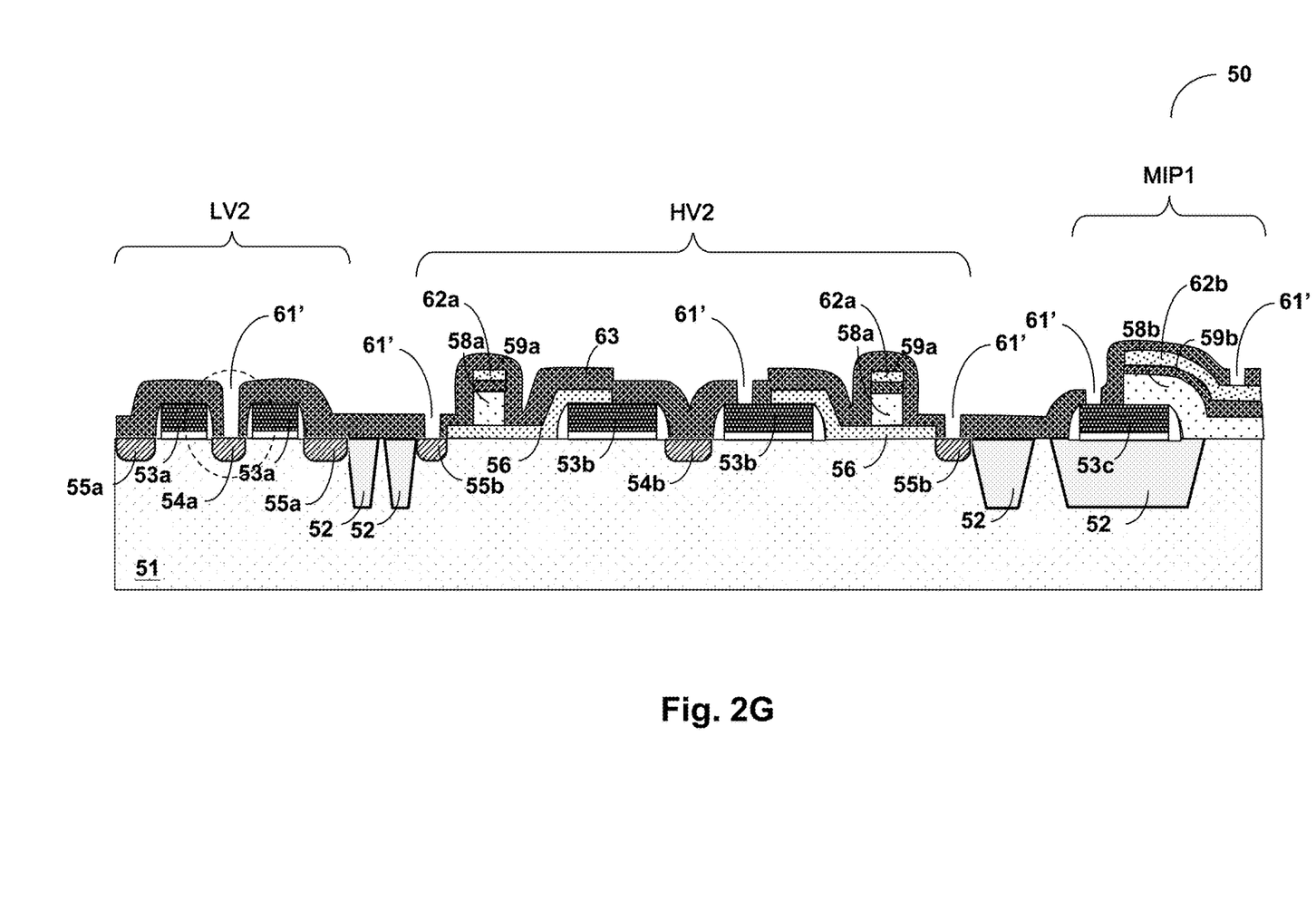

Next, referring to FIG. 2G, the contact etch stop layer 63 is etched by an etching process, so that plural contact holes 61' are formed in the contact etch stop layer 63, and the contact hole 61' between the two low-voltage gates 53*a* exposes at least part of the top surface of the common low-voltage source 54*a* on the substrate 51. The etching process for etching the contact etch stop layer 63 may include an over-etch step, so that the conductive plugs to be formed later can form better electrical contact with the contact surface.

Figure 2H:
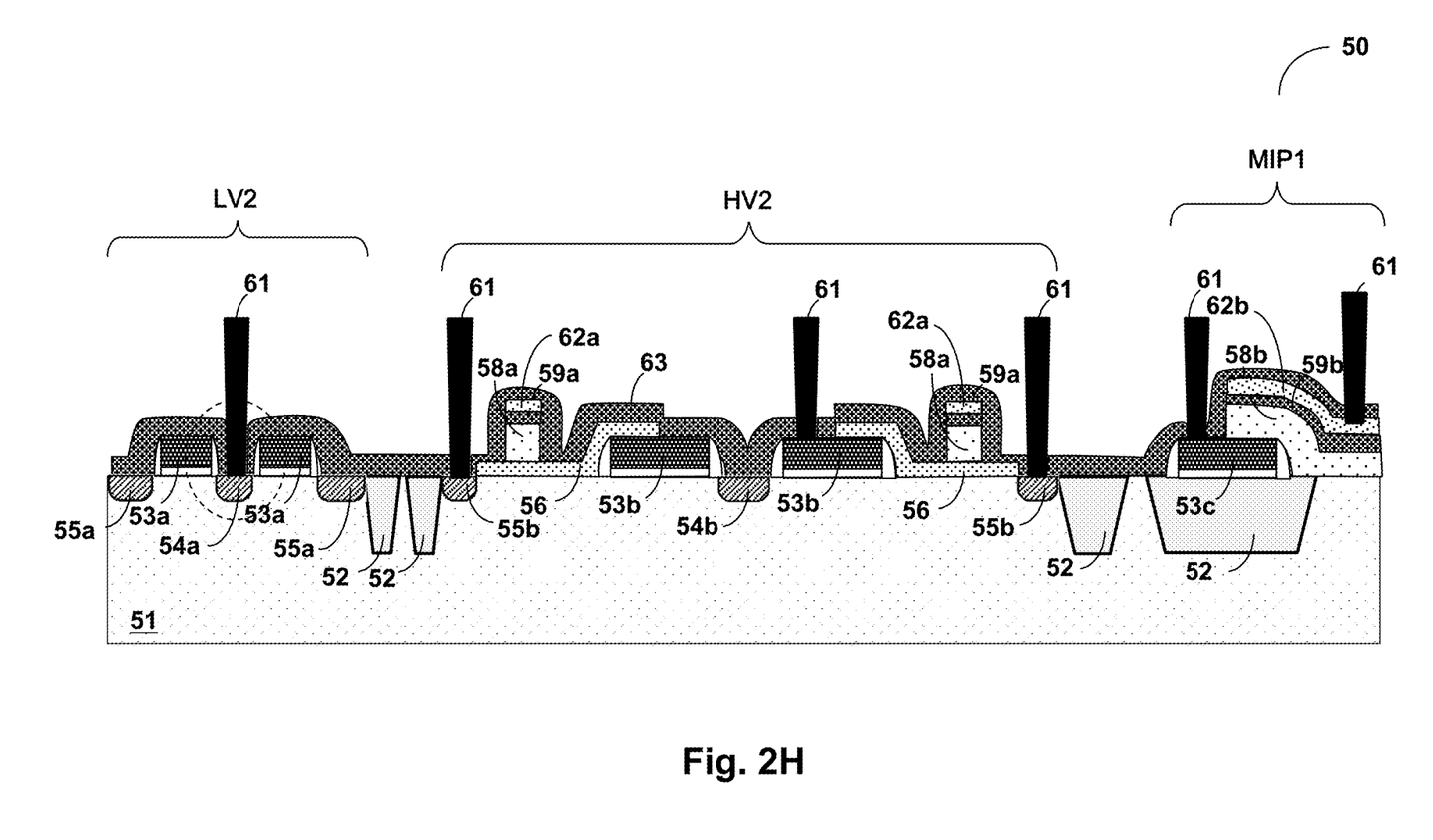

Next, referring to FIG. 2H, plural conductive plugs 61 are formed in the corresponding plural contact holes 61', and each conductive plug 61 fills the corresponding contact hole 61' from top to bottom thoroughly.

One of the differences between the present invention and the conventional art is that before depositing the silicon oxide layer, the first silicon nitride layer 57 is deposited first. After the first silicon nitride layer 57 is etched back, a residual silicon nitride layer is formed on the substrate 51 where the structural space is relatively small. Since the material of the etch stop layer for the subsequent etching of the contact hole is also silicon nitride, the residual silicon nitride layer can be totally removed, so that the conductive plug will not be blocked from the residual silicon oxide, and the conductive plug can be electrically connected to a desired electric node, such as the common low-voltage source 54*a*, in a region where the structural space is relatively small.

In one embodiment, the material of the split gate top electrode 62*a* includes polysilicon, titanium nitride, tantalum nitride, or tungsten.

In one embodiment, the material used to form the split gate silicon oxide region 57*a* includes tetraethoxysilane (TEOS).

In one embodiment, the split gate silicon oxide region 57*a* is formed by a high temperature oxidation (HTO) process or a high aspect ratio process (HARP).

In one embodiment, the thickness of the reduced surface field oxide regions 56 directly under the split gate SG2 is 200 Å.

In one embodiment, the thickness of the MIP insulating region ranges from 500 Å to 700 Å.

In one embodiment, the thickness of the low-voltage gate oxide layer of the low-voltage gate 53*a* ranges from 80 Å to 130 Å.

In one embodiment, a gate driving voltage of the high-voltage gate 53*b* ranges from 3.3V to 5V.

In one embodiment, a drain driving voltage of the high-voltage gate 53*b* ranges from 6V to 30V.

In one embodiment, the split gate top electrode 62*a* is electrically connected to the high-voltage gate 53*b* or the ground potential.

In one embodiment, a minimum feature size of the integrated structure 50 of the semiconductor device with the split gate ranges from 0.05 microns to 0.3 microns.

The present invention has been described in considerable detail with reference to certain preferred embodiments thereof. It should be understood that the description is for illustrative purpose, not for limiting the broadest scope of the present invention. Those skilled in this art can readily conceive variations and modifications within the spirit of the present invention. The various embodiments described above are not limited to being used alone; two embodiments may be used in combination, or a part of one embodiment may be used in another embodiment. For example, other process steps or structures, such as a deep well region, may be added. For another example, the lithography process step is not limited to the mask technology but it can also include electron beam lithography, immersion lithography, etc. Therefore, in the same spirit of the present invention, those skilled in the art can think of various equivalent variations and various combinations, and there are many combinations thereof, and the description will not be repeated here. The scope of the present invention should include what are defined in the claims and the equivalents.

What is claimed is:

1. A manufacturing method of an integrated structure of a semiconductor device having split gates, comprising:
   forming two low-voltage gates of a low-voltage device on a substrate and forming a common low-voltage source and two low-voltage drains of the low-voltage device in the substrate;
   forming two high-voltage gates and two reduced surface field oxide regions of a high-voltage device on the substrate and forming a common high-voltage source and two high-voltage drains of the high-voltage device in the substrate;
   forming a first silicon nitride layer covering the low-voltage device and the high-voltage device;
   etching back the first silicon nitride layer by an etching process to form a residual silicon nitride layer on the substrate between the two adjacent low-voltage gates;
   forming a silicon oxide layer covering the low-voltage device and the high-voltage device;
   forming a second silicon nitride layer covering the silicon oxide layer;
   forming a metal layer covering the second silicon nitride layer;
   etching the metal layer, the second silicon nitride layer, and the silicon oxide layer by at least one etching process to form two split gates respectively on the two reduced surface field oxide regions, wherein each split gate comprises a split gate top electrode, a split gate silicon nitride region, and a split gate silicon oxide region;
   forming a contact etch stop layer covering the low-voltage device and the high-voltage device, wherein a material of the contact etch stop layer is silicon nitride;
   etching the contact etch stop layer by an etching process to form a plurality of contact holes in the contact etch stop layer, wherein the contact hole between the two low-voltage gates exposes at least part of a top surface of the common low-voltage source on the substrate; and
   forming a plurality of conductive plugs in the corresponding plurality of contact holes, wherein each of the conductive plugs fills in the corresponding contact holes from top to bottom.

2. The manufacturing method of the integrated structure of the semiconductor device having split gates of claim 1, further comprising forming a metal-insulator-polysilicon (MIP) capacitor in the substrate, wherein the MIP capacitor comprises:
  a MIP polysilicon region formed above the substrate;
  a MIP insulating region formed on and in contact with the MIP polysilicon region and the substrate;
  a MIP metal region formed on and in contact with the MIP insulating region;
  wherein the MIP metal region and the split gate top electrode are formed by one same process;
  wherein the MIP insulating region, the split gate silicon nitride region, and the split gate silicon oxide region are formed by one same process; and
  wherein the MIP polysilicon region and a high-voltage polysilicon region of the high-voltage gate are formed by one same process.

3. The manufacturing method of the integrated structure of the semiconductor device having split gates of claim 1, wherein a material of the split gate top electrode comprises polysilicon, titanium nitride, tantalum nitride, or tungsten.

4. The manufacturing method of the integrated structure of the semiconductor device having split gates of claim 1, wherein a material used for forming the split gate silicon oxide region comprises tetraethoxysilane (TEOS).

5. The manufacturing method of the integrated structure of the semiconductor device having split gates of claim 1, wherein the split gate silicon oxide region is formed by a high temperature oxidation (HTO) process or a high aspect ratio process (HARP).

6. The manufacturing method of the integrated structure of the semiconductor device having split gates of claim 1, wherein a thickness of the reduced surface field oxide region positioned directly under the split gate is 200 angstrom (Å).

7. The manufacturing method of the integrated structure of the semiconductor device having split gates of claim 2, wherein a thickness of the MIP insulating region ranges from 500 Å to 700 Å.

8. The manufacturing method of the integrated structure of the semiconductor device having split gates of claim 1, wherein a thickness of a low-voltage gate oxide layer of the low-voltage gate ranges from 80 Å to 130 Å.

9. The manufacturing method of the integrated structure of the semiconductor device having split gates of claim 1, wherein a gate driving voltage of the high-voltage gates ranges from 3.3V to 5V.

10. The manufacturing method of the integrated structure of the semiconductor device having split gates of claim 1, wherein a drain driving voltage of the high-voltage gates ranges from 6V to 30V.

11. The manufacturing method of the integrated structure of the semiconductor device having split gates of claim 1, wherein the split gate top electrode is electrically connected to the high-voltage gates or a ground potential.

12. The manufacturing method of the integrated structure of the semiconductor device having split gates of claim 1, wherein a minimum feature size of the integrated structure of the semiconductor device having split gates ranges from 0.05 micrometer (μm) to 0.3 μm.

* * * * *